US006613607B2

(12) United States Patent
Janssen et al.

(10) Patent No.: US 6,613,607 B2
(45) Date of Patent: Sep. 2, 2003

(54) METHOD FOR MANUFACTURING ENCAPSULATED ELECTRONIC COMPONENTS, PARTICULARLY INTEGRATED CIRCUITS

(75) Inventors: Johannes Bernardus Petrus Janssen, Malden (NL); Johannes Bernardus de Vrught, Zeddam (NL)

(73) Assignee: "3P" Licensing B.V., Zevenaar (NL)

( * ) Notice: Subject to any disclaimer, the term of this patent is extended or adjusted under 35 U.S.C. 154(b) by 0 days.

(21) Appl. No.: 10/021,455

(22) Filed: Oct. 29, 2001

(65) Prior Publication Data
US 2002/0064926 A1 May 30, 2002

Related U.S. Application Data

(63) Continuation of application No. PCT/NL00/00280, filed on May 1, 2000.

(30) Foreign Application Priority Data

Apr. 29, 1999 (NL) .............................................. 1011929

(51) Int. Cl.[7] .............................................. H01L 21/44
(52) U.S. Cl. ........................ 438/110; 438/112; 438/127
(58) Field of Search ................................ 438/106, 107, 438/110, 111, 112, 113, 118, 125, 126, 127

(56) References Cited

U.S. PATENT DOCUMENTS

| 3,635,754 A | | 1/1972 | Beede | |
| 3,754,070 A | | 8/1973 | Dunn et al. | |
| 4,980,016 A | | 12/1990 | Tada et al. | |
| 5,218,759 A | | 6/1993 | Juskey et al. | |
| 5,693,573 A | | 12/1997 | Choi | |
| 6,033,933 A | * | 3/2000 | Hur | 438/112 |
| 6,048,483 A | | 4/2000 | Miyajima | |
| 6,087,202 A | * | 7/2000 | Exposito et al. | 438/113 |

FOREIGN PATENT DOCUMENTS

| EP | 0611129 A2 | 8/1994 |
| EP | 0890425 A1 | 1/1999 |
| JP | 10209190 | 8/1998 |

* cited by examiner

Primary Examiner—Kamand Cuneo
Assistant Examiner—Scott B. Geyer
(74) Attorney, Agent, or Firm—Hoffmann & Baron, LLP

(57) ABSTRACT

A method for manufacturing encapsulated electronic components, particularly integrated circuits, is provided. The method includes the steps of: a) attaching electronic components on a first side of an electrically conducting support and electrically connecting the electronic components to the electrically conducting support; b) using a mold to encapsulate the electronic components with an encapsulating material on just the first side of the electrically conducting support, while a second side of the support is substantially completely shielded with the aid of an adhesive film; and c) removing the adhesive film and separating, along cutting lines, the individual encapsulated electronic components, wherein bonding of the adhesive film to a second side to be shielded of the electrically conducting support takes place between step a) and step b).

7 Claims, 6 Drawing Sheets

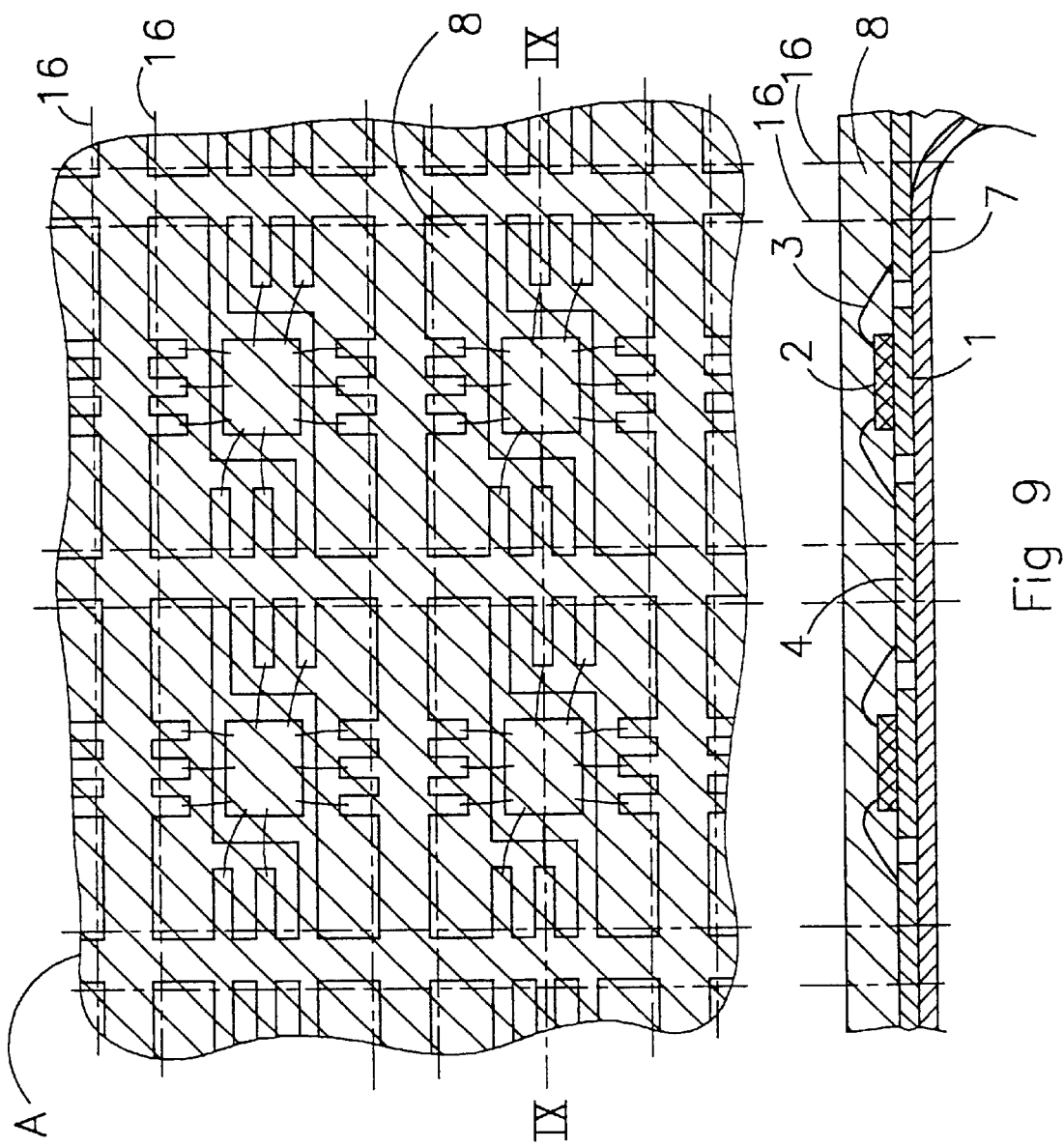

METHOD FOR MANUFACTURING ENCAPSULATED ELECTRONIC COMPONENTS, PARTICULARLY INTEGRATED CIRCUITS

CROSS-REFERENCE TO RELATED APPLICATION

This is a continuation application of PCT/NL00/00280 filed May 1, 2000, which PCT application claims priority from Dutch Application No. 1011929 filed Apr. 29, 1999, herein incorporated by reference.

FIELD OF THE INVENTION

The present invention relates to a method for manufacturing encapsulated electronic components, particularly integrated circuits, at least successively comprising the following steps:

a) attaching electronic components on a first side of an electrically conducting support and electrically connecting the electronic components to the electrically conducting support;

b) using a mould to encapsulate the electronic components in one or more mould cavities with an encapsulating material on just the first side of the electrically conducting support, while a second side of the support is substantially completely shielded with the aid of an adhesive film;

c) removing the adhesive film and separating, along cutting lines, the individual encapsulated electronic components.

BACKGROUND OF THE INVENTION

Such a method is generally known from the prior art. This generally involves providing an electrically conducting support with an adhesive film, before the electronic components are fitted. This can easily be done without any risk of damaging the electronic components. Integrated circuits, for example, are very fragile components which are easily damaged. The very thin gold connecting wires in particular are susceptible to damage.

After the adhesive films have been applied, the electronic components are attached to the support, for example by cementing (die-bonding). This is often done by means of an epoxy adhesive which requires curing at elevated temperature. Such a temperature increase is found to impair adhesion of the adhesive film.

Then the connecting wires of the electronic components are electrically connected to the electrically conducting support, for example by welding (e.g. thermosonic), soldering or the like (wire-bonding). This temperature increase too is found to impair adhesion of the adhesive film.

In the present application, the term "electrically conducting support" refers, for example, to a lead frame. A lead frame is a metal support which comprises many very fine leads which are connected to the connecting wires of the electric components. It will be evident that if an adhesive film has been bonded to one side of such a lead frame, any actions having adverse impact on adhesion should be avoided, since such leads easily become detached from the adhesive film, with all the adverse consequences thereof.

Then the support with adhesive film and electronic components is introduced into a mould, a so-called transfer-moulding technique often being employed to encapsulate the electronic components on the first side of the support in one or more mould cavities with an encapsulating material (compound). During encapsulation, any contact of the encapsulating material with the second side of the electrically conducting support should be avoided. Those electrically conducting areas of the support which were left free on said second side of the support serve for electrical connection of the electronic components at the time of their ultimate use.

Finally, the adhesive film is removed and the encapsulated electronic components are separated from one another along cutting lines, after which they are suitable for further processing.

If the leads or other parts of the lead frame are not unambiguously bonded to the adhesive film, there is the possibility of encapsulating material penetrating between the adhesive film and the lead frame during encapsulation. As a result, electrically conducting areas can become insulated, thereby rendering subsequent electrical connection impossible. In the prior art, bonding between the adhesive film and the support is not unambiguous and reproducible, since the many heat treatments (attaching of electrical components and electrically connecting them to the support) often leads to locally reduced adhesion of the adhesive film. It is also possible for parts of the support to become detached from the adhesive film owing to a difference in expansion coefficient between the support and the adhesive film during heating or cooling operations.

Equally it is advisable, of course, to keep handling of the support with an adhesive film thereon to a minimum. Any movement, bending or the like of the support with the adhesive film thereon may induce local detachment of the adhesive film from the support.

SUMMARY OF THE INVENTION

In the prior art there is therefore a considerable need for an improved method for manufacturing encapsulated electronic components in the manner mentioned in the introduction. It is an object of the present invention to meet said need, the invention thereto being characterized in that bonding of the adhesive film to the second side to be shielded of the electrically conducting support takes place between step a) and step b), as described above.

The method according to the invention allows optimal bonding between the adhesive film and the second side of the electrically conducting support to be ensured reproducibly.

After the adhesive film has been mounted, no further heat treatments take place which impair adhesion, since after mounting of the adhesive film only the electronic components in the mould will remain encapsulated.

It should be noted, that U.S. Pat. No. 5,218,759 discloses a method for manufacturing encapsulated electronic components which uses an adhesive film which is applied just before encapsulation of the electronic components in a mould. This, however, does not relate to an electrically conducting support, but instead to a support made of ceramic material, for example. The problem to which the present invention provides a solution is not addressed.

According to the invention, the adhesive film can be bonded to the support just prior to insertion into the mould or within the mould itself. Preferably, the adhesive film is introduced into the mould, after which the electrically conducting support with the electronic components on the second side is bonded onto it.

Thus, any unnecessary handling of the support with the adhesive film thereon is avoided.

The way in which the electrically conducting support with the electronic components is bonded, according to the invention, to the adhesive film is not particularly limited. In a preferred embodiment, the bonding of the adhesive film to the electrically conducting support is effected with the use of a press-on part which comprises press-on projections of such design, that they can be aligned with the cutting lines. In other words, the press-on part is of such design that the support can be pressed onto the adhesive film at positions between the electronic components. All this will be explained below in further detail in the description of the figures.

Preferentially, a press-on part is used which comprises suitably shaped recesses for the individual electronic components, the bridges between the recesses forming the press-on projections. This embodiment will likewise be explained in more detail in the description of the figures.

The adhesive film according to the invention is not particularly limited, but it is important that substantially no residue remains after the adhesive film is removed. Suitable adhesives for use on the adhesive film comprise, for example, so-called temporary adhesives which lose their adhesion after some time, thermoplastic adhesives, thermosetting adhesives and so-called superglue and the like. Superglue has very good adhesion, but low peeling strength.

Preferably, the adhesive film comprises a base film with an adhesive layer, said adhesive layer comprising a material which becomes adhesive as a result of an increase in temperature.

As encapsulation of the electronic components often takes place at elevated temperature, it is advantageous to use such an adhesive.

More preferably, the adhesive layer comprises a hot melt adhesive. Said hot melt adhesive preferably comprises a modified polymer, and more preferably the modified polymer comprises modified polyethylene terephthalate.

When the electrically conducting support is bonded to the adhesive film it would be possible, depending on the pressure force, for material of the adhesive film to penetrate into recesses or openings of the support. In practice, this is considered undesirable as it has the consequence that, after encapsulation on the second side, the surface of the support is not located in the same plane as the surface of the encapsulating material. Preferably, the thickness of the adhesive layer according to the invention is therefore as small as possible, advantageously less than 5 μm.

Advantageously, in step b) at least two electronic components per mould cavity are encapsulated.

The present invention is particularly advantageous with so-called matrix lead frames. Such matrix lead frames comprise very small and fragile leads, owing to the large number of small electronic components which are grouped thereon, a set of components being encapsulated within a mould cavity. In other words, accurate bonding of the adhesive film is of crucial importance in this context.

The invention further provides an adhesive film, at least comprising a base film with an adhesive layer, designed for use in the method according to the invention.

Finally, the invention provides a press-on part designed for use in the method according to the invention. Preferably, the press-on part comprises a flat steel plate which is provided with suitably shaped recesses for accommodating electronic components while the electrically conducting support is pressed onto the adhesive film.

Other features and advantages of the present invention will be explained with reference to the accompanying drawings, in which like reference symbols indicate like parts.

BRIEF DESCRIPTION OF THE DRAWINGS

FIG. 9 again shows the enlarged section A from the lead frame according to FIG. 7, provided with encapsulating material.

DESCRIPTION OF THE PREFERRED EMBODIMENT

Figure 1:
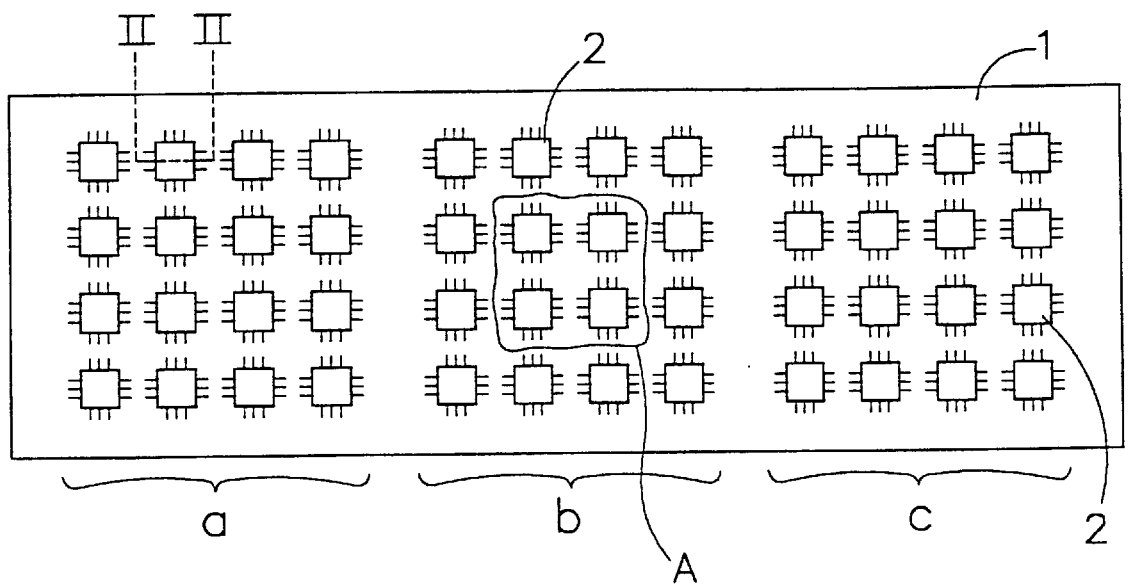
FIG. 1 shows a plan view from above of a matrix lead frame comprising three sets of integrated circuits.

In FIG. 1, 1 schematically indicates an embodiment of an electrically conducting support according to the invention, a so-called copper lead frame. Said lead frame 1 comprises three sets (a, b, c) of integrated circuits (ICs) 2. A lead frame 1 of this type is known as a matrix lead frame.

Figure 2:
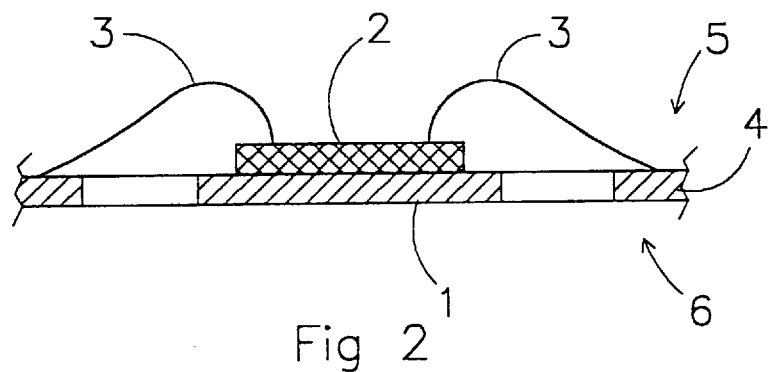
FIG. 2 shows a section on II—II in FIG. 1.

FIG. 2 depicts a section through the lead frame according to FIG. 1 on II—II. Again, the lead frame 1 and the IC 2 can be seen here, the IC being connected, with the aid of gold wires 3, to leads 4 which form part of the lead frame 1.

Figure 3:
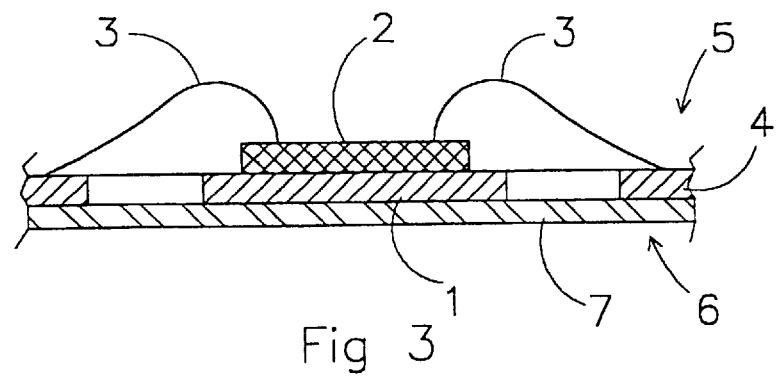
FIG. 3 shows the same section as in FIG. 2, an adhesive film having been applied.

The lead frame 1 comprises a first side 5 and a second side 6. According to the invention, an adhesive film 7 is mounted on the second side 6 of the lead frame 1, as shown in FIG. 3. Then the assembly is encapsulated, on the first side 5, in a mould with the aid of an encapsulating material 8, after which the adhesive film 5 is removed and the ICs in question are separated from one another.

Figure 4:
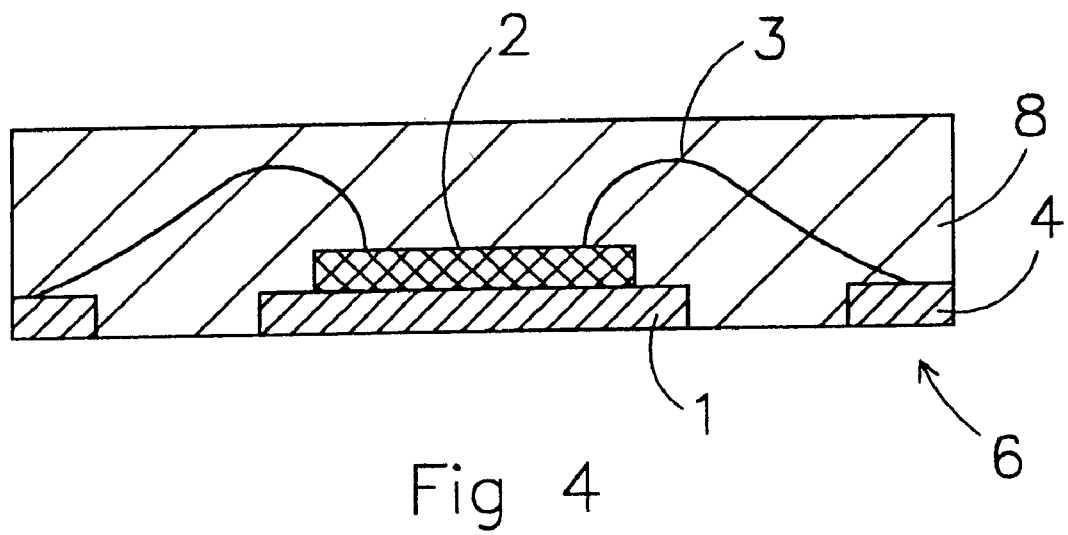
FIG. 4 shows a section on II—II after encapsulation.

An encapsulated IC thus manufactured is shown in FIG. 4. It will be obvious that both the underside of the lead frame 1 and local encapsulating material 8 are visible on the second side 6.

The encapsulating material 8 in practice often comprises a thermosetting material which, as used during the encapsulating operation, has a low viscosity.

In the figure, the adhesive film used is a polyethylene film with a modified polyethylene terephthalate adhesive layer having a thickness of 5 μm.

Figure 5:
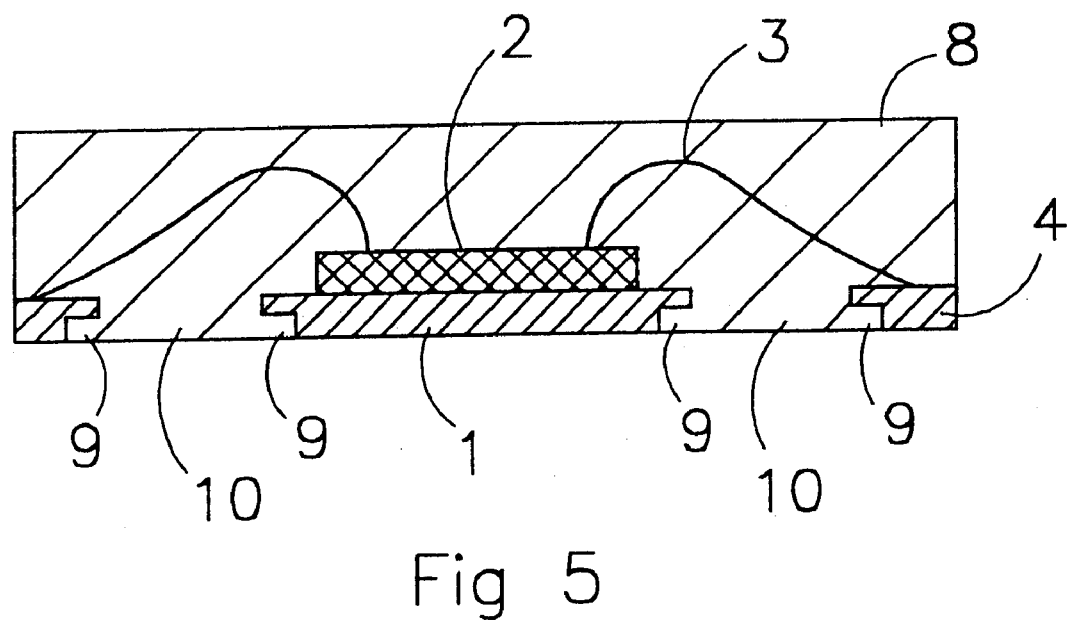
FIG. 5 shows a section of an encapsulated integrated circuit or a support with an anchoring arrangement.

FIG. 5 shows a specific embodiment of an encapsulated integrated circuit showing a particularization of the lead frame 1. The lead frame 1 there locally comprises recesses 9 which, after encapsulation of the integrated circuit 2, are likewise filled with encapsulating material and form so-called anchorings 10. The anchorings 10 provide a very durable attachment of the encapsulating material to the assembly of IC 2 and lead frame 1.

Figure 6:
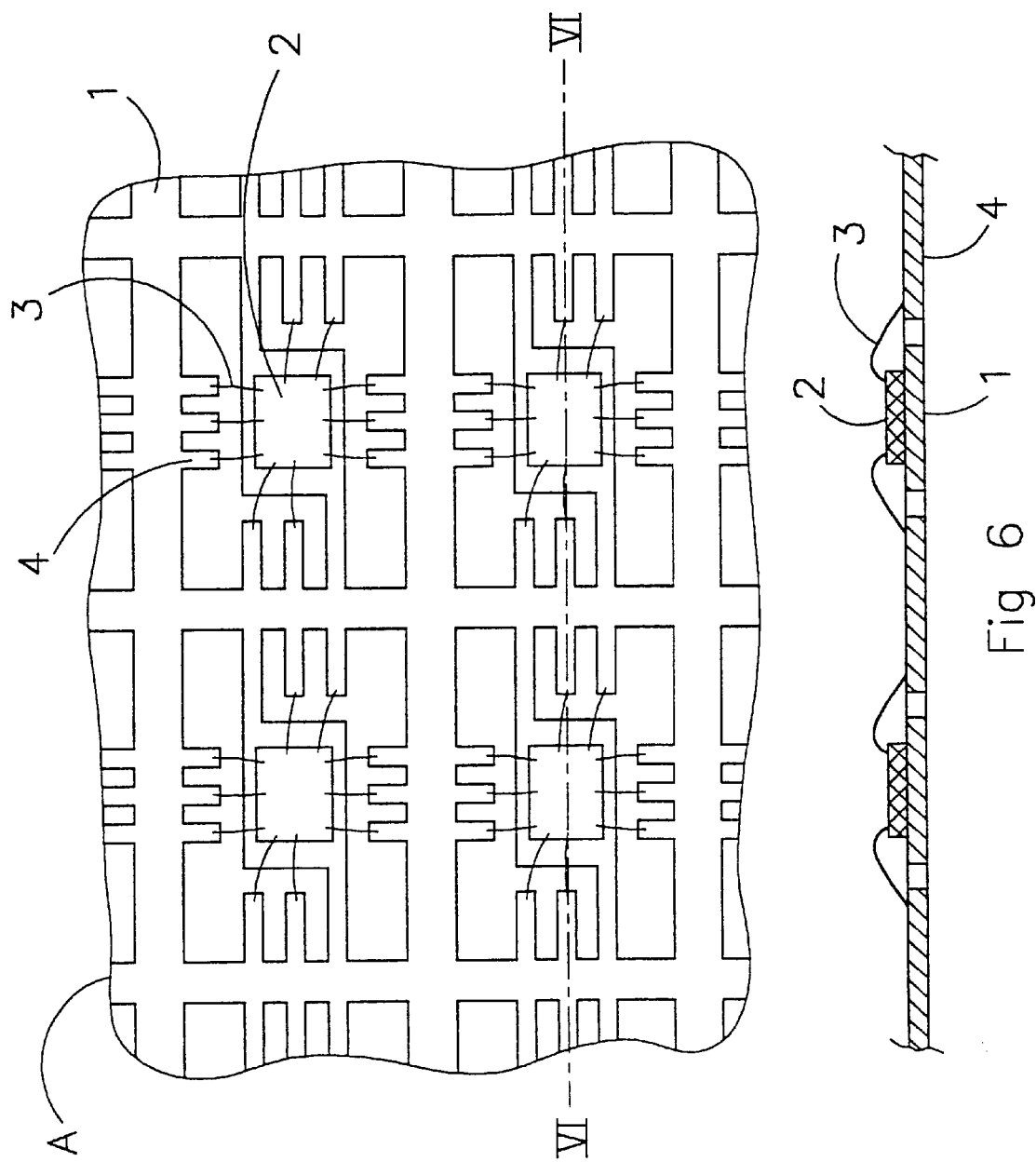
FIG. 6 shows a plan view from above of an enlargement A of the lead frame according to FIG. 1 and an enlarged section.

FIG. 6 shows an enlargement of the section A from FIG. 1 of the lead frame 1, identical reference numerals indicating identical components. The section shown in FIG. 6 at the bottom is the section on VI—VI.

Figure 7:
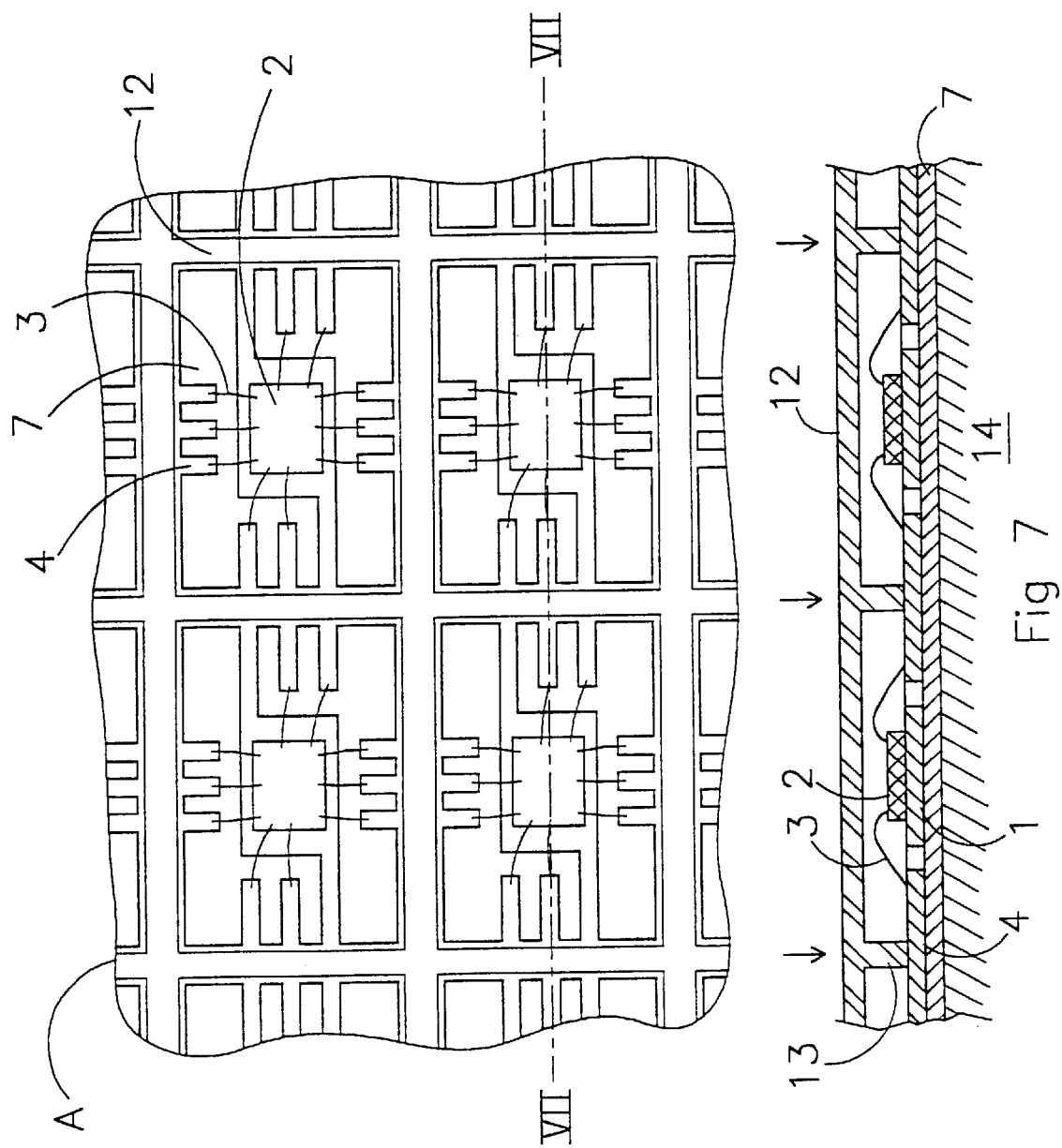
FIG. 7 shows the same view as FIG. 6, but provided with an adhesive film and a press-on part.

FIG. 7 shows the same enlargement A, except that an adhesive film 7 has likewise been mounted on the lead frame 1, and a press-on part 12 is present on top of the lead frame.

The press-on part 12 comprises press-on projections 13. The press-on projections 13 are continuous circumferential projections which press onto the lead frame 1 at those locations where the integrated circuits 2, having been encapsulated, will be separated from one another, in other words at the location of the cutting lines.

Preferably, the adhesive film 7 is laid into the mould first of all, before encapsulation, after which the lead frame 1 with the integrated circuits 2 thereon is introduced into the mould. 14 schematically depicts a bottom mould half which is generally held at an elevated temperature. Owing to the elevated temperature, the adhesive film 7 will become adhesive, thus allowing the lead frame 1 to be bonded thereto. Then the lead frame 1 is pressed onto the adhesive film in the direction of the arrows with the aid of the press-on part 12. FIG. 7, at the bottom, shows a section on VII—VII.

Figure 8:
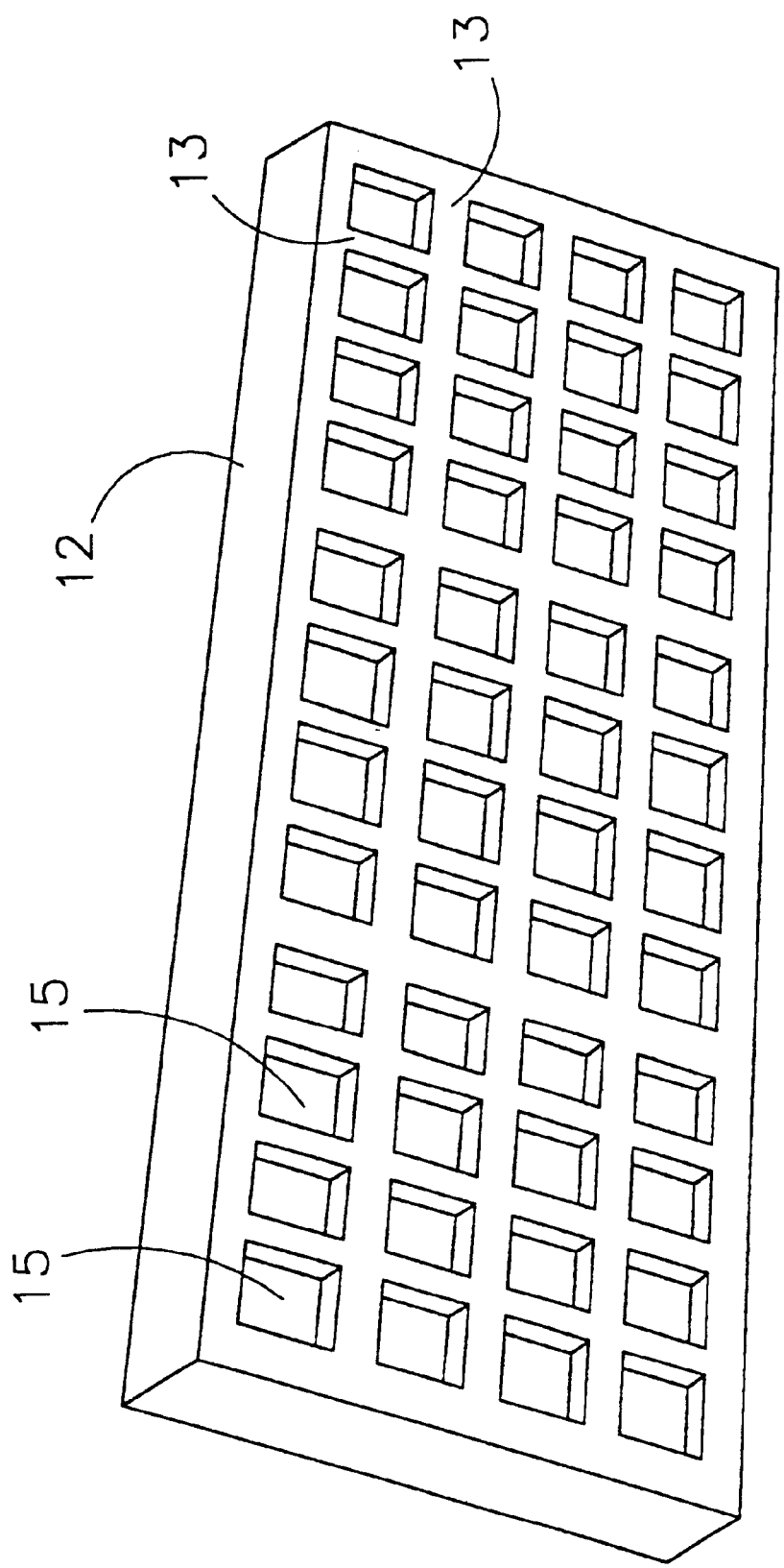
FIG. 8 shows a perspective view of a press-on part according to the invention.

FIG. 8 schematically shows a perspective view of a press-on part 12 which is provided with recesses 15 which are arranged in such a way that they can be aligned with the integrated circuits 2 on the lead frame 1. The bridges between the recesses 15 form the press-on projections 13.

FIG. 9, finally, again shows the enlargement of section A, the electronic components of the lead frame 1 having been encapsulated with encapsulating material 8 after the adhesive film 7 has been applied. Again, at the bottom of the figure, a section on IX—IX is depicted. In this section it is equally clear how the film 7 can be removed after encapsulation. This purpose can be served, for example, by suitable heating means which heat the film to some degree in order to facilitate removal.

The dot-and-dash lines 16 indicate the so-called saw cuts or cutting lines, along which the integrated circuits thus encapsulated are separated from one another. These could be double cutting lines, but it would be equally possible to use a saw blade having a suitable thickness, in order to saw away the material between the dot-and-dash lines 16. This purpose can equally be served by a laser technique, punching technique or some other separation technique.

It will be clear that it is advantageous, according to the invention, for the press-on projections 13 of the press-on part 12 to be aligned with said cutting lines, so that the integrated circuits or gold connecting wires 3 are not damaged while the lead frame 1 is pressed onto the adhesive film 7.

It is to be understood that the above description has been made for exemplary purpose only, and that departures therefrom may be made without departing from the scope of the appended claims.

What is claimed is:

1. A method for manufacturing encapsulated electronic components, particularly integrated circuits, at least successively comprising the following steps:
    a) attaching electronic components on a first side of an electrically conducting support and electrically connecting the electronic components to the electrically conducting support;
    b) using a mould to encapsulate the electronic components with an encapsulating material on just the first side of the electrically conducting support, while a second side of the support is substantially completely shielded with the aid of an adhesive film;
    c) removing the adhesive film and separating, along cutting lines, the individual encapsulated electronic components,
        wherein bonding of the adhesive film to a second side to be shielded of the electrically conducting support takes place between step a) and step b), and further wherein the bonding of the adhesive film to the electrically conducting support is effected with the use of a press-on part which comprises press-on projections of such design, that they can be aligned with the cutting lines.

2. A method according to claim 1, wherein the adhesive film is introduced into the mould, after which the electrically conducting support with the electronic components on the first side thereof is bonded with its second side to the adhesive film.

3. A method according to claim 1, wherein the press-on part is used which comprises suitably shaped recesses for the individual electronic components, the bridges between the recesses forming the press-on projections.

4. A method according to claim 1, wherein in step b) at least two electronic components per mould cavity are encapsulated.

5. A method for manufacturing encapsulated electronic components, particularly integrated circuits, at least successively comprising the following steps:
    a) attaching electronic components on a first side of an electrically conducting support and electrically connecting the electronic components to the electrically conducting support;
    b) using a mould to encapsulate the electronic components with an encapsulating material on just the first side of the electrically conducting support, while a second side of the support is substantially completely shielded with the aid of an adhesive film;
    c) removing the adhesive film and separating, along cutting lines, the individual encapsulated electronic components,
        wherein bonding of the adhesive film to a second side to be shielded of the electrically conducting support takes place between step a) and step b), wherein the adhesive film comprises a base film and an adhesive layer, said adhesive layer comprising a material which becomes adhesive as a result of an increase in temperature, wherein the adhesive layer comprises a hot melt adhesive, wherein the hot melt adhesive comprises a modified polymer, wherein the modified polymer comprises modified polyethylene terephthalate.

6. A method according to claim 5, wherein the thickness of the adhesive layer is less than 5 micrometers.

7. A method according to claim 5, wherein in step b) at least two electronic components per mould cavity are encapsulated.

* * * * *